United States Patent
Kim

(10) Patent No.: US 8,531,897 B2
(45) Date of Patent: Sep. 10, 2013

(54) DELAY CONTROL CIRCUIT AND SEMICONDUCTOR MEMORY DEVICE INCLUDING THE SAME

(75) Inventor: Kyung-Whan Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 209 days.

(21) Appl. No.: 13/208,683

(22) Filed: Aug. 12, 2011

(65) Prior Publication Data
US 2012/0269014 A1    Oct. 25, 2012

(30) Foreign Application Priority Data
Apr. 21, 2011    (KR) .................. 10-2011-0037346

(51) Int. Cl.
*G11C 7/22*    (2006.01)
*G11C 8/18*    (2006.01)

(52) U.S. Cl.
USPC ............... 365/194; 365/233.1; 365/233.12; 365/233.13

(58) Field of Classification Search
USPC ........... 365/193, 194, 233.1, 233.12, 233.13
See application file for complete search history.

(56) References Cited

U.S. PATENT DOCUMENTS

| 6,339,553 | B1 * | 1/2002 | Kuge | ........................... 365/194 |
| 7,274,185 | B2 * | 9/2007 | Kim | ........................... 324/76.61 |
| 2006/0017429 | A1 * | 1/2006 | Kim | ........................... 324/76.61 |

FOREIGN PATENT DOCUMENTS

| KR | 100722775 | 5/2007 |
| KR | 100866958 | 11/2008 |

OTHER PUBLICATIONS

Notice of Allowance issued by the Korean Intellectual Property Office on Sep. 28, 2012.

* cited by examiner

*Primary Examiner* — J. H. Hur
(74) *Attorney, Agent, or Firm* — IP & T Group LLP

(57) ABSTRACT

A delay control circuit includes a delay locked loop configured to delay an external clock by a first delay amount and generate an internal clock, a first delay unit configured to delay an input signal by a first delay amount, a first replica delay unit having a replica delay amount corresponding to a modeled delay amount of a system, a delay control unit configured to control the replica delay amount in response to a latency of an input signal, a measurement unit configured to measure the first delay amount and the controlled replica delay amount and generate path information, an operation unit configured to generate delay information in response to the latency of the input signal and the path information, and a latency delay unit configured to delay the delayed input signal of the first delay unit by the delay information and generate a latency signal.

20 Claims, 8 Drawing Sheets

DELAY CONTROL CIRCUIT AND SEMICONDUCTOR MEMORY DEVICE INCLUDING THE SAME

CROSS-REFERENCE TO RELATED APPLICATIONS

The present application claims priority of Korean Patent Application No. 10-2011-0037346, filed on Apr. 21, 2011, which is incorporated herein by reference in its entirety.

BACKGROUND

1. Field

Exemplary embodiments of the present invention relate to a delay control circuit for generating a latency signal and a semiconductor memory device including the same.

2. Description of the Related Art

Semiconductor devices may exchange signals and data with each other. For example, in the case of a semiconductor memory device, such as a dynamic random access memory (DRAM), if a memory controller of a system applies a read command to a memory device, the memory device outputs data stored in a memory cell region and transfers the data to the memory controller. However, the memory device does not output data immediately when it receives the read command, because a certain time is taken to prefetch and align data in the memory device and output the aligned data.

In order to facilitate mutual operations of several semiconductor devices, it is desired to define such a time measured from the input of a command into a semiconductor device to the performance by the semiconductor device in response to the command. This time is called a latency. For example, in a DRAM, a CAS latency (CL) is defined as a time taken from the input of a read command to the actual output of data. If CL=5 clocks (tCK), data is to be outputted through a data output pad (DQ) after a time corresponding to 5 clocks from the input of the read command to the DRAM. A delay control circuit serves to control a delay amount of various signals inputted to the semiconductor device so that operations relative to the signals can be performed at accurate timings based on latencies of the signals.

Meanwhile, the delay control circuit is generally used with a delay locked loop (DLL) in order to control delay amounts of signals or data outputted from the semiconductor device based on latencies of various types of input signals. The DLL includes a circuit for synchronization of clocks used in a system and semiconductor devices. For example, a semiconductor device, such as a double data rate synchronous DRAM (DDR SDRAM), uses a DLL to generate an internal clock by delaying an external clock used in an external system by a predetermined time, and transmits various signals and data using the internal clock. This is because, although the clock initially inputted to the semiconductor device is synchronized with the external clock, it is delayed while passing through several elements inside the device and therefore it is not synchronized with the external clock when outputted to the outside of the device. To transmit signals and data stably to the external system, the internal clock and the external clock are to be accurately synchronized with each other by compensating the internal clock for the time taken to load data on a bus within the semiconductor device. To this end, the DLL is used.

FIG. 1 is a configuration diagram of a conventional delay control circuit, and FIGS. 2A and 2B are operation timing diagrams of the delay control circuit illustrated in FIG. 1.

Referring to FIG. 1, the conventional delay control circuit includes a DLL 100, a signal selection unit 107, a first delay unit 109, a first replica delay unit 111, a measurement unit 113, an operation unit 115, and a latency delay unit 117. The DLL 100 includes a second delay unit 101, a second replica delay unit 103, and a phase comparison unit 105.

The overall operation of the delay control circuit includes locking a first delay amount A of the DLL 100, measuring path information N using a measurement signal CNT, and generating a latency signal CMD_LT of a driving signal CMD.

In the step of locking the first delay amount A of the DLL 100, the second delay unit 101 delays the external clock EXTCLK by the first delay amount A to generate the internal clock DLLCLK. The second replica delay unit 103 delays the internal clock DLLCLK by the replica delay amount B to generate the feedback clock FBCLK. The internal clock DLLCLK may be used in a semiconductor chip including the delay control circuit, and the external clock EXTCLK may be a system clock that is commonly used in an entire system including a semiconductor chip. The replica delay amount B refers to modeled values of time taken for the internal clock DLLCLK to reach a target circuit (not shown) within the semiconductor chip.

The feedback clock FBCLK is inputted to the phase comparison unit 105 together with the external clock EXTCLK. The phase comparison unit 105 compares phases of the two clocks EXTCLK and FBCLK and controls the first delay amount A. Through these procedures, the phase comparison unit 105 determines the value of the first delay amount A accurately by synchronizing the phases of the two clocks EXTCLK and FBCLK (at this time, the first delay amount A is called "locked"), and both of the first delay unit 109 and the second delay unit 101 have the locked value of the first delay amount A.

In the step of measuring the path information N, as illustrated in FIG. 2A, the measurement signal CNT is activated and simultaneously inputted to the first delay unit 109 and the measurement unit 113 through the signal selection unit 107. The first delay unit 109 delays the measurement signal CNT by the first delay amount A and transfers the delayed measurement signal CNT_A to the first replica delay unit 111, and the first replica delay unit 111 further delays the delayed measurement signal CNT_A by the replica delay amount B and outputs the delayed measurement signal CNT_B. The first replica delay unit 111 may be designed to be identical to the second replica delay unit 103 of the DLL 100.

The measurement unit 113 measures a difference of a delay amount between the measurement signal CNT and the delayed measurement signal CNT_B and generates the path information N. To be specific, the measurement value obtained by counting the number of toggling of the external clock EXTCLK from the point of time when the measurement signal CNT is activated to the point of time when the measurement signal CNT_B delayed through the first delay unit 109 and the first replica delay unit 111 is activated is generated as the path information N. That is, the path information N is the value representing the sum (A+B) of the first delay amount A and the second delay amount B in clock units (tCK). The path information is the value obtained by measuring the time, taken until the signal inputted to the semiconductor device reaches the target circuit, based on the clock unit (tCK).

In the step of generating the latency signal CMD_LT of the driving signal CMD, as illustrated in FIG. 2B, the driving signal CMD of the target circuit is inputted through the signal selection unit 107, and the first delay unit 109 delays the driving signal CMD by the first delay amount A and outputs the delayed driving signal CMD_A. Therefore, the delayed driving signal CMD_A is synchronized with the internal clock DLLCLK.

The operation unit 115 subtracts the path information N from the latency LT of the driving signal CMD and provides the delay information DLI (DLI=LT−N) to the latency delay unit 117. As illustrated in FIG. 2B, if the latency LT of the driving signal CMD is 5 clocks and the path information N is 2 clocks, the delay information DLI becomes 3 clocks.

The latency delay unit 117 further delays the delayed driving signal CMD_A from the first delay unit 109 by the delay information DLI (3 clocks), and generates the latency signal CMD_LT. After the time corresponding to the replica delay amount B, the latency signal CMD_LT reaches the target circuit which actually performs an operation relative to the driving signal CMD. Therefore, the target circuit can perform the operation relative to the driving signal CMD after the time corresponding to the latency LT (5 clocks) from the input of the driving signal CMD to the semiconductor device.

However, process, voltage and temperature (PVT) variations of the semiconductor device may cause an error in the first delay amount A and the replica delay amount B. Thus, the measurement value of the path information N may be smaller or larger than the practical value. In particular, it is highly likely to cause such an error when the delay control circuit is used in the semiconductor device whose frequency range is very wide, just like DDR3 or DDR4 SDRAM

SUMMARY

An embodiment of the present invention is directed to a delay control circuit, which can generate a latency signal of a driving signal at an accurate timing for a wide operating frequency range, without errors, and a semiconductor memory device including the same.

In accordance with an embodiment of the present invention, a delay control circuit includes: a delay locked loop configured to delay an external clock by a first delay amount and generate an internal clock; a first delay unit configured to delay an input signal by the first delay amount; a first replica delay unit having a replica delay amount corresponding to a modeled delay amount of a system including the delay control circuit; a delay control unit configured to control the replica delay amount in response to a latency of an input signal; a measurement unit configured to measure the first delay amount and the controlled replica delay amount and generate path information; an operation unit configured to generate delay information in response to the latency of the input signal and the path information; and a latency delay unit configured to delay the delayed input signal of the first delay unit by the delay information and generate a latency signal.

In accordance with yet another embodiment of the present invention, a delay control circuit includes: a delay locked loop configured to delay an external clock by a first delay amount and generate an internal clock; a first delay unit configured to delay a measurement signal or a driving signal by the first delay amount based on an operation step; a first replica delay unit configured to delay the measurement signal outputted from the first delay unit by a replica delay amount; a delay control unit configured to control the replica delay amount in response to a latency of the driving signal; a measurement unit configured to generate path information in response to the measurement signal inputted to the first delay unit and the measurement signal outputted from the first replica delay unit; an operation unit configured to generate delay information in response to the latency of the driving signal and the path information; and a latency delay unit configured to delay the driving signal in response to from the first delay unit by the delay information and generate a latency signal.

In accordance with still another embodiment of the present invention, a semiconductor memory device includes: a delay locked loop configured to delay an external clock by a first delay amount and generate an internal clock; a first delay unit configured to delay a measurement signal or a driving signal by the first delay amount based on an operation step; a first replica delay unit configured to delay the measurement signal outputted from the first delay unit by a replica delay amount; a delay control unit configured to control the replica delay amount in response to a latency of the driving signal; a measurement unit configured to generate path information in response to the measurement signal inputted to the first delay unit and the measurement signal outputted from the first replica delay unit; an operation unit configured to generate delay information in response to the latency of the driving signal and the path information; a latency delay unit configured to delay the driving signal outputted from the first delay unit by the delay information and generate a latency signal; and a data input/output unit configured to perform a data input/output operation when the latency signal is activated.

DETAILED DESCRIPTION

Figure 1:
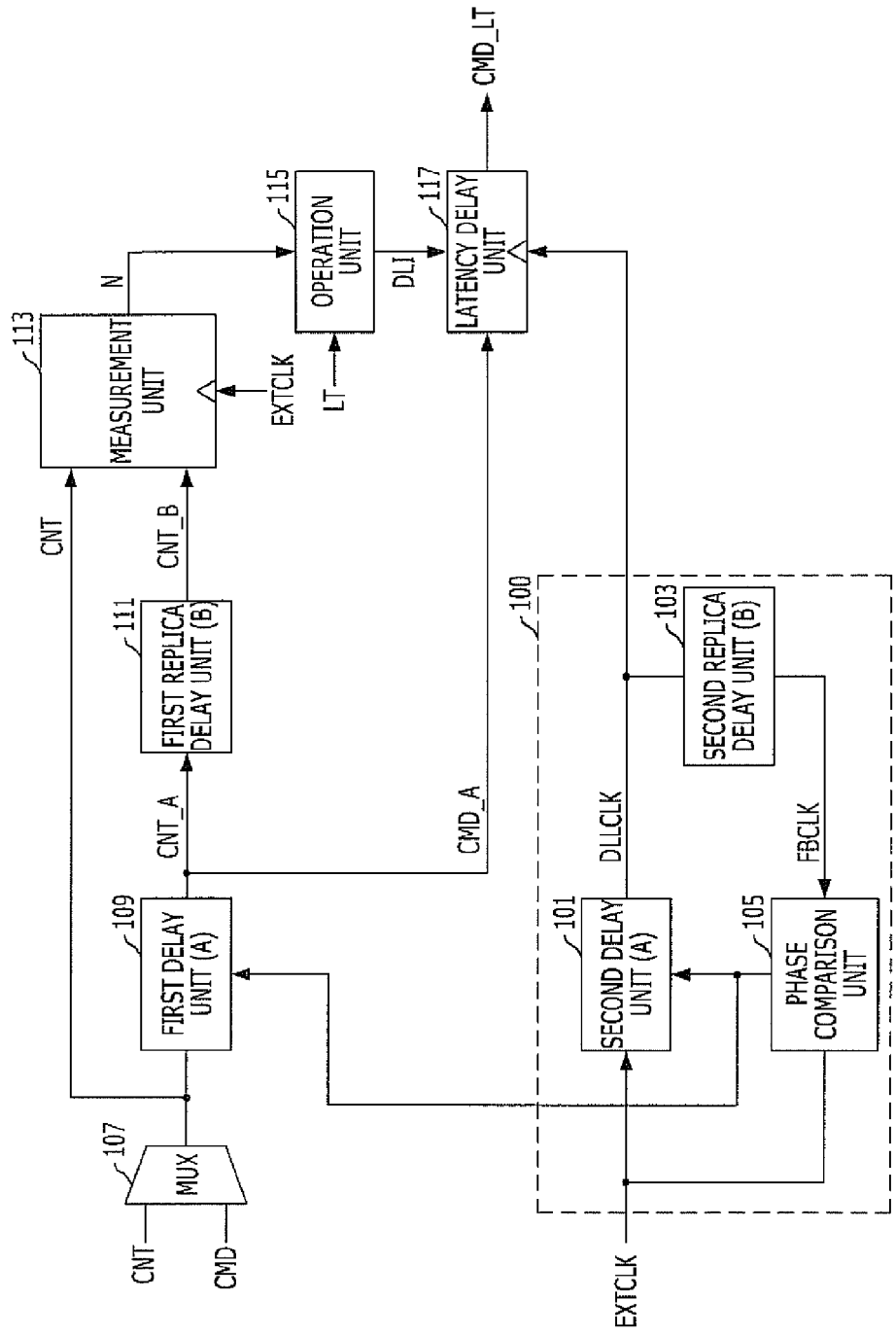
FIG. 1 is a configuration diagram of a conventional delay control circuit.
Figure 2A:
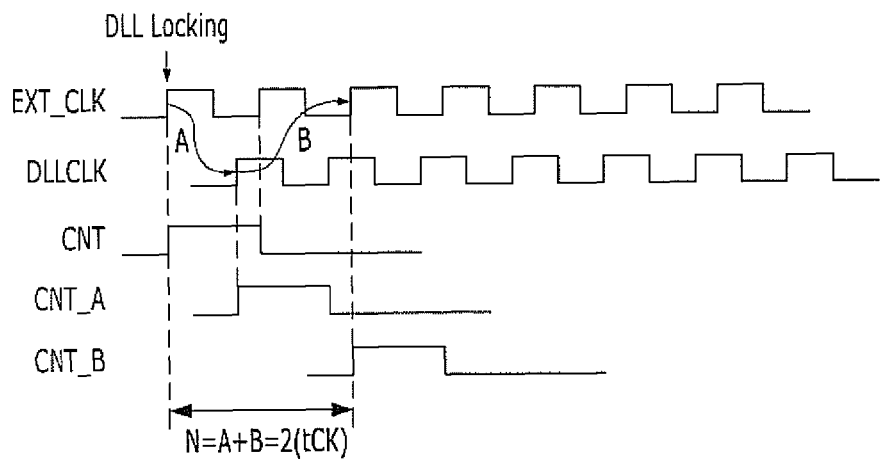
FIGS. 2A and 2B are operation timing diagrams of the delay control circuit illustrated in FIG. 1.
Figure 2B:
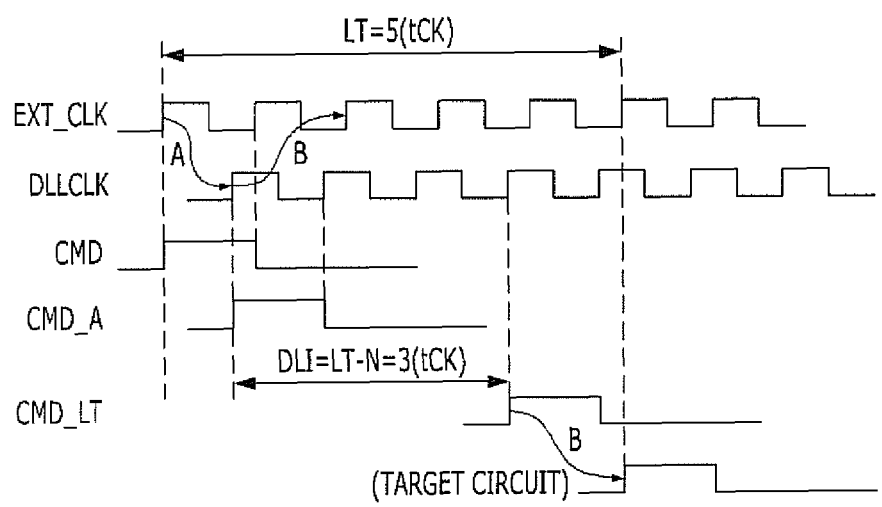

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
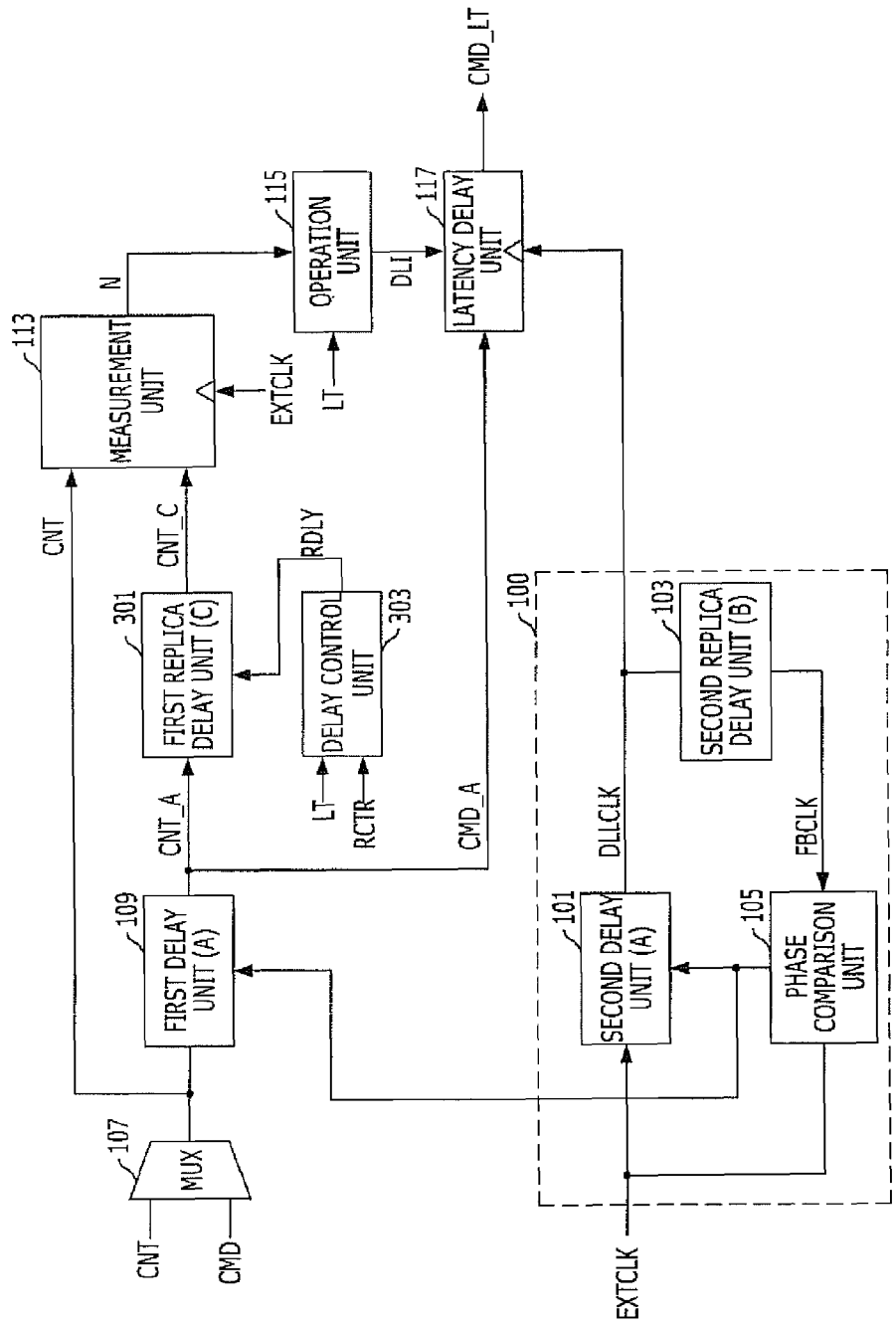
FIG. 3 is a configuration diagram of a delay control circuit in accordance with an embodiment of the present invention.

FIG. 3 is a configuration diagram of a delay control circuit in accordance with an embodiment of the present invention.

Referring to FIG. 3, the delay control circuit in accordance with the embodiment of the present invention includes a DLL 100, a first delay unit 109, a first replica delay unit 301, a delay control unit 303, a measurement unit 113, an operation unit 115, and a latency delay unit 117. The DLL 100 delays an external clock EXTCLK by a first delay amount A to generate an internal clock DLLCLK. The first delay unit 109 delays a measurement signal CNT or a driving signal CMD by the first delay amount A based on an operation step. The first replica delay unit 301 delays the measurement signal CNT_A from the first delay unit 109 by a replica delay amount C. The delay control unit 303 controls the replica delay amount C in response to a latency LT of the driving signal CMD. The measurement unit 113 generates path information N using the measurement signal CNT inputted to the first delay unit 109 and the measurement signal CNT_C outputted from the first replica delay unit 301. The operation unit 115 generates delay information DLI using the latency LT of the driving signal CMD and the path information N. The latency delay unit 117 delays the driving signal CMD_A from the first delay unit 109 by the delay information DLI and generates the latency signal CMD_LT. In addition, the delay control circuit may further include a signal selection unit 107 that selectively transfers the measurement signal CNT and the driving signal CMD to the first delay unit 109 based on an operation step.

The DLL 100 includes a second delay unit 101, a second replica delay unit 103, and a phase comparison unit 105. The second delay unit 101 delays the external clock EXTCLK by the first delay amount A to generate the internal clock DLLCLK. The second replica delay unit 103 delays the internal clock DLLCLK by a delay amount B to generate a feedback clock FBCLK. The delay amount B is a modeled value of a delay amount on a signal path inside a chip. The phase comparison unit 105 compares the phase of the external clock EXTCLK with the phase of the feedback clock FBCLK and controls the first delay amount A.

The overall operation of the delay control circuit in accordance with the embodiment of the present invention includes a locking step of locking the first delay amount A of the DLL 100, a measuring step of generating path information N using a measurement signal CNT, and a delaying step of generating a latency signal CMD_LT by delaying the driving signal CMD.

In accordance with the embodiment of the present invention, in the step of generating the path information N, the replica delay amount C of the first replica delay unit 301 is controlled in response to the latency LT of the driving signal CMD, and thus, the path information N is generated without errors. That is, since the latency LT of the driving signal CMD is set to have a value corresponding to an operating frequency range of a semiconductor device, the accurate path information N can be generated by setting an optimized replica delay amount C in each predetermined frequency range using a method of controlling the replica delay amount C in response to the latency of the driving signal CMD.

The step of locking the first delay amount A of the DLL 100 is substantially identical to that described above with reference to FIG. 1. The second delay unit 101 delays the external clock EXTCLK by the first delay amount A to generate the internal clock DLLCLK. The second replica delay unit 103 delays the internal clock DLLCLK by the replica delay amount B to generate the feedback clock FBCLK. The internal clock DLLCLK may be used in a semiconductor chip including the delay control circuit, and the external clock EXTCLK may be a system clock that is commonly used in an entire system including a semiconductor chip.

The feedback clock FBCLK is inputted to the phase comparison unit 105 together with the external clock EXTCLK. The phase comparison unit 105 compares the phases of the two clocks EXTCLK and FBCLK and controls the first delay amount A. Through these procedures, the phase comparison unit 105 determines the value of the first delay amount A accurately by synchronizing the phases of the two clocks EXTCLK and FBCLK at this time, the first delay amount A is called "locked"), and both of the first delay unit 109 and the second delay unit 101 have the locked value of the first delay amount A.

When the first delay amount A is locked, the measurement signal CNT is activated and the process proceeds to the measuring step. The signal selection unit 107 transfers the activated measurement signal CNT to the first delay unit 109, and the first delay unit 109 delays the measurement signal CNT by the first delay amount A and outputs the delayed measurement signal CNT_A. The first replica delay unit 301 delays the delayed measurement signal CNT_A by the replica delay amount C controlled by the delay control unit 303 and outputs the delayed measurement signal CNT_C.

The first replica delay unit 301 in accordance with the embodiment of the present invention may be designed to be identical to the second replica delay unit 103 of the DLL 100, except that the replica delay amount C of the first replica delay unit 301 is additionally controlled through the delay control unit 303 in response to the latency LT of the driving signal CMD. Thus, the replica delay amount C may be different from the delay amount B of the second replica delay unit 103, which is described in detail with reference to FIGS. 4 to 6.

Figure 4:
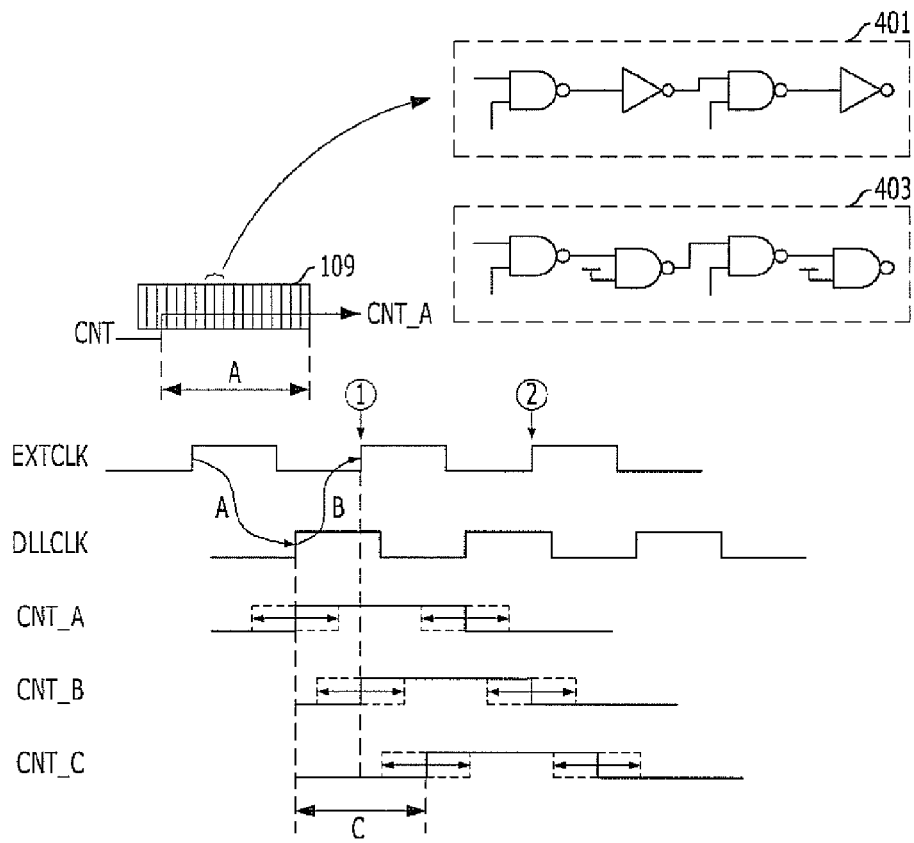
FIG. 4 is a diagram explaining a method for controlling a replica delay amount in a low frequency operation.

FIG. 4 is a diagram explaining a method for controlling a replica delay amount C in a low frequency operation.

Referring to FIG. 4, when the operating frequency is low, the clock cycle (tCK) is increased. Thus, the delay amount A of the first delay unit 109 is increased because it is determined based on the clock cycle. In general, the first delay unit 109 is configured with a plurality of delays each having unit delay amount. Since each of the delays may include a NAND gate and an inverter (401) connected in series or include two NAND gates connected in series (403), the variation range of the first delay amount A is increased as the first delay amount A is increased. Therefore, the path information N may be measured to be smaller than a proper value by 1 clock.

Thus, when the operating frequency is low, the replica delay amount C of the first replica delay unit 301 is sufficiently increased. Though the variation range due to PVT variations is considered, the delayed measurement signal CNT_C can be controlled so that it is activated later than the rising edge ① of the external clock EXTCLK. In this case, the delayed measurement signal CNT_C should be activated earlier than the rising edge ② of the external clock EXTCLK. In this manner, the path information N is prevented from being measured to be smaller by 1 clock in the low frequency operation.

Figure 5:
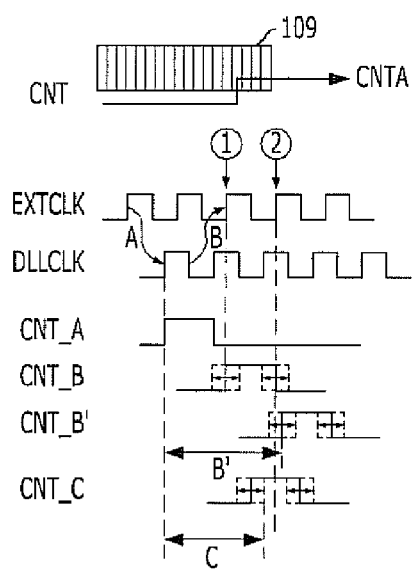
FIG. 5 is a diagram explaining a method for controlling a replica delay amount in a high frequency operation.

FIG. 5 is a diagram explaining a method for controlling a replica delay amount C in a high frequency operation.

Referring to FIG. 5, in a case in which the operating frequency is high, the first delay amount A becomes smaller than a case in which the operating frequency is low. Therefore, the variation range of the first delay amount A due to PVT variations is not so wide. However, even though the variation range is small, the path information N may still be measured to be smaller by 1 clock. In a case in which the replica delay amount is set to be large for the low frequency operation as in FIG. 4, the measurement signal CNT is significantly delayed like a signal CNT_B' and thus the path information N may be measured to be larger by 1 clock.

Therefore, in the case in which the operating frequency is high, the replica delay amount C of the first replica delay unit 301 is slightly increased. Though the variation range due to PVT variations is considered, the delayed measurement signal CNT_C can be controlled so that it is activated between the rising edge ① and the rising edge ② of the external clock EXTCLK. In this manner, the path information N is prevented from being measured to be smaller or larger by 1 clock in the high frequency operation.

The delay control unit 303 generates a delay control signal RDLY in response to the latency LT of the driving signal CMD and a replica control signal RCTR. The latency LT may be composed of 3-bit information LTI<2:0>, and the delay control signal RDLY may be composed of eight signals RDLY<0> to RDLY<7>. However, it is apparent that the bit number of the latency (LT) information and the number of the corresponding delay control signal RDLY may be changed, depending on design.

Figure 6:
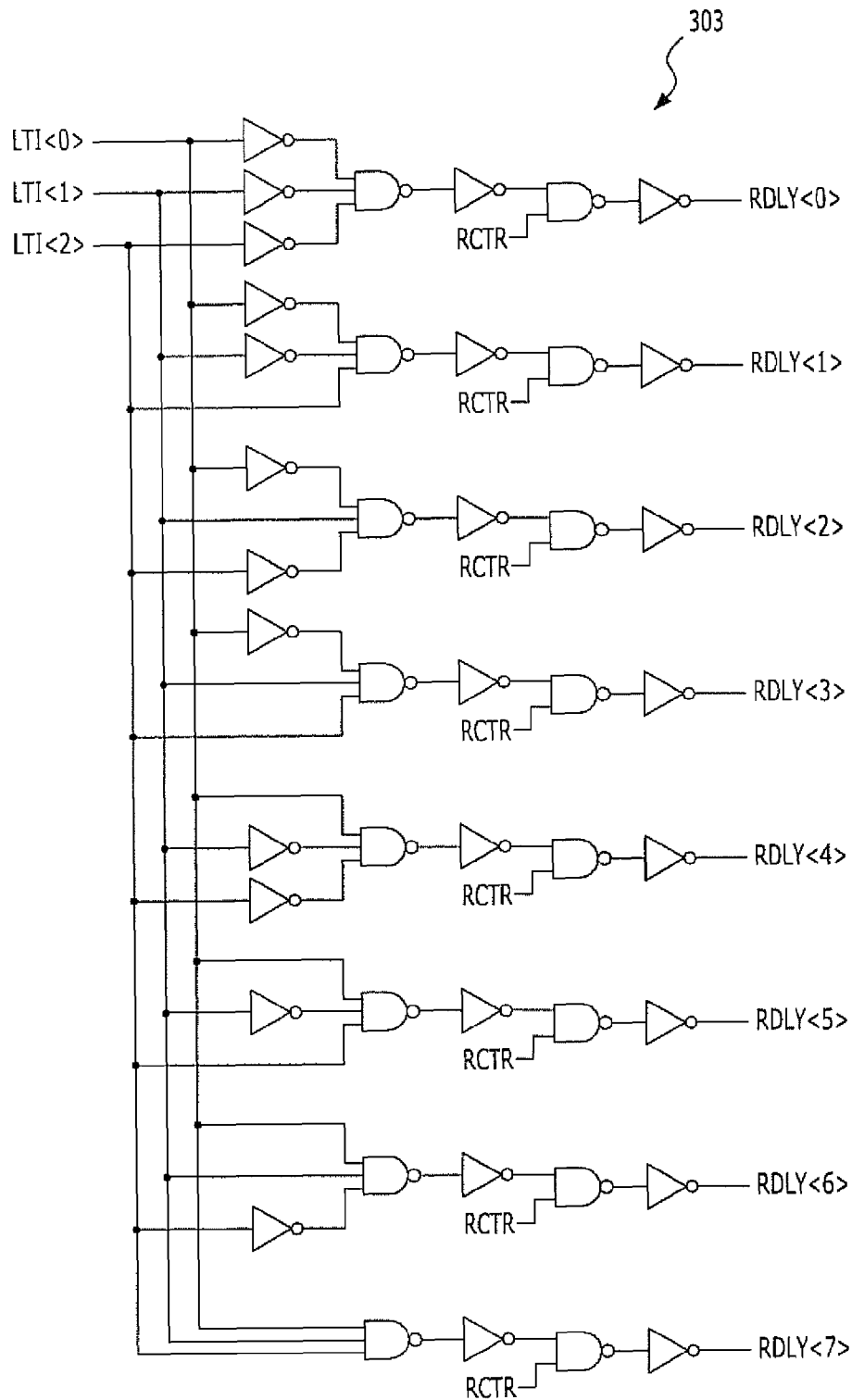
FIG. 6 is a configuration diagram of a delay control unit illustrated in FIG. 3.

FIG. 6 is a configuration diagram of the delay control unit 303 illustrated in FIG. 3.

Referring to FIG. 6, the delay control unit 303 may be implemented as a decoder including a plurality of NAND gates and a plurality of inverters. The delay control unit 303 generates eight delay control signals RDLY<0> to RDLY<7> based on the decoding result of the 3-bit latency information LTI<2:0> when the replica control signal RCTR is activated. The replica control signal RCTR may be activated to a high level when the step of generating the path information N is started.

Table 1 below shows the latency LT of the specific driving signal CMD determined based on the operating frequency, that is, the clock cycle (tCK), the corresponding 3-bit latency information LTI<2:0>, and the delay control signals RDLY<0> to RDLY<7> activated based on the decoding result of the latency information LTI<2:0>

TABLE 1

| Clock Cycle (tCK) | Latency (LT) | LTI<2:0> | Activated Signal (RDLY) |
|---|---|---|---|
| tCK ≧ 2.5 (ns) | 5 (tCK) | 000 | RDLY<0> |
| 1.875 ≦ tCK < 2.5 (ns) | 6 (tCK) | 001 | RDLY<1> |
| 1.5 ≦ tCK < 1.875 (ns) | 7 (tCK) | 010 | RDLY<2> |
| 1.25 ≦ tCK < 1.5 (ns) | 8 (tCK) | 011 | RDLY<3> |
| 1.07 ≦ tCK < 1.25 (ns) | 9 (tCK) | 100 | RDLY<4> |
| 0.935 ≦ tCK < 1.07 (ns) | 10 (tCK) | 101 | RDLY<5> |
| 0.833 ≦ tCK < 0.935 (ns) | 11 (tCK) | 110 | RDLY<6> |
| 0.75 ≦ tCK < 0.833 (ns) | 12 (tCK) | 111 | RDLY<7> |

As such, the latency LT of the driving signal CMD may be set differently based on the range of the operating frequency (clock cycle), and the delay control unit 303 may generate the delay control signals RDLY<0> to RDLY<7> in response to the latency information LTI<2:0> at the operating frequency.

Figure 7:
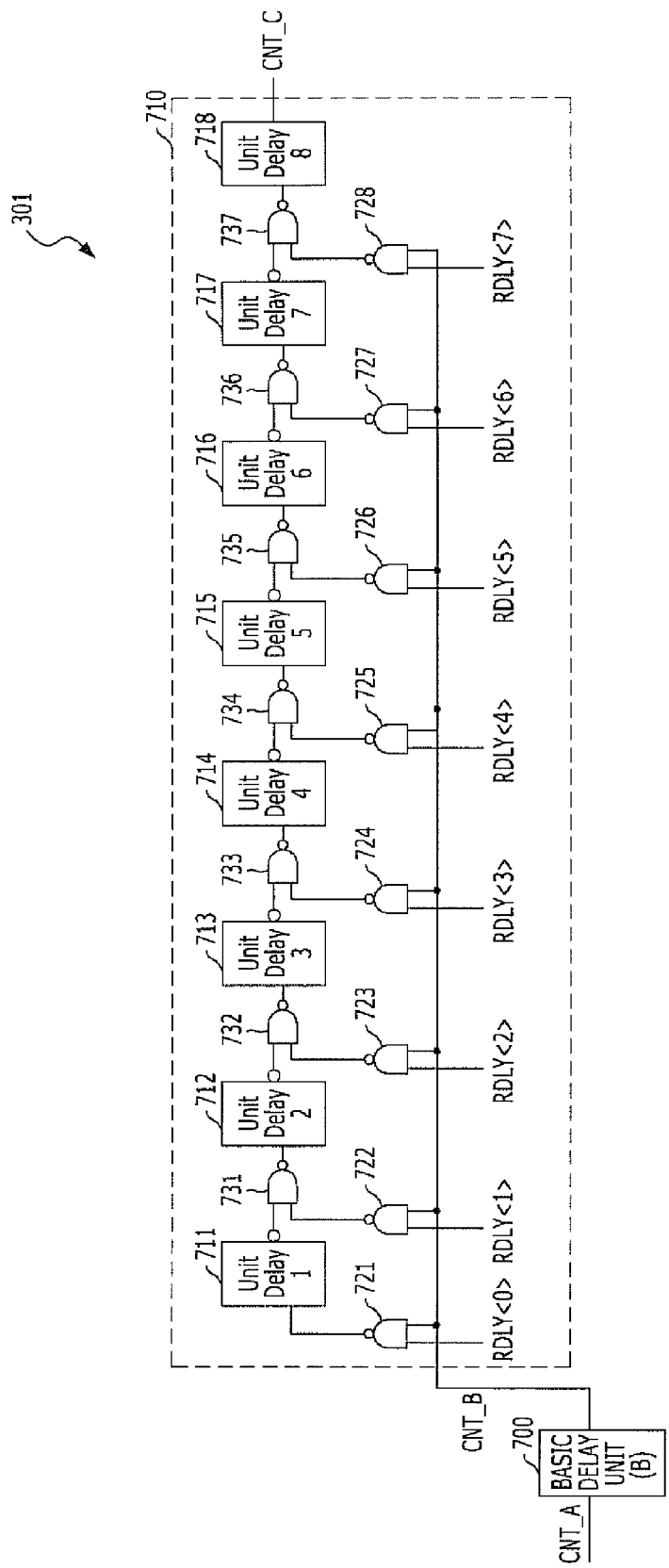
FIG. 7 is a configuration diagram of a first replica delay unit illustrated in FIG. 3.

FIG. 7 is a configuration diagram of the first replica delay unit 301 illustrated in FIG. 3.

Referring to FIG. 7, the first replica delay unit 301 may include a basic delay unit 700 and an additional delay unit 710. The basic delay unit 700 has the same delay amount B as the second replica delay unit 103 of the DLL 100. The additional delay unit 710 has an additional delay amount corresponding to the operating frequency. The sum of the delay amount B of the basic delay unit 700 and the delay amount of the additional delay unit 710 becomes the replica delay amount C.

The additional delay unit 703 may include a plurality of unit delays 711 to 718 and a plurality of NAND gates 721 to 728 and 731 to 737. The replica delay amount C may be set differently based on the operating frequency by controlling the delay path of the measurement signal CNT_B using the delay control signals RDLY<0> to RDLY<7> inputted to the NAND gates 721 to 728.

For example, when the latency LT of the driving signal CMD is 5 clocks (tCK(ns)≧2.5), the signal RDLY<0> is activated to a high level. Thus, the measurement signal CNT_B is inputted through the NAND gate 721, passes through eight delays 711 to 718, and is outputted as the signal CNT_C. Consequently, the total replica delay amount C is increased. On the other hand, when the latency LT of the driving signal CMD is 12 clock (0.75≦tCK(ns)<0.83), the signal RDLY<7> is activated to a high level. Thus, the measurement signal CNT_B is inputted through the NAND gate 728, passes through the single delay 718, and is outputted as the signal CNT_C. Consequently, the total replica delay amount C is decreased. In this manner, the replica delay amount C may be set differently based on the operating frequency range.

Referring back to FIG. 3, the operation of the measurement unit 113 is described.

The measurement unit 113 measures a difference of a delay amount between the measurement signal CNT and the delayed measurement signal CNT_C and generates the path information N. To be specific, the measurement value obtained by counting the number of toggling of the external clock EXTCLK from the point of time when the measurement value CNT is activated to the point of time when the measurement signal CNT_C delayed through the first delay unit 109 and the first replica delay unit 301 is activated is generated as the path information N. That is, the path information N is the value representing the sum (A+C) of the first delay amount A and the replica delay amount C in clock units (tCK).

Figure 8:
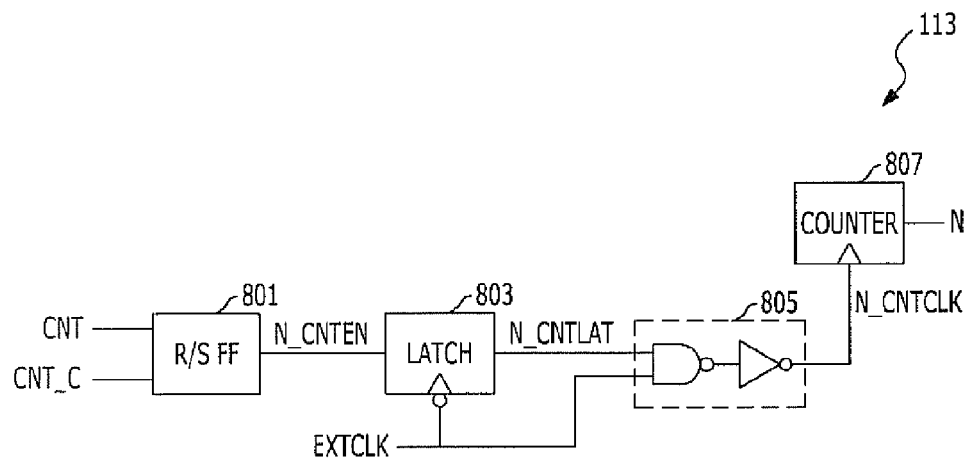
FIG. 8 is a configuration diagram of a measurement unit illustrated in FIG. 3.
Figure 9:
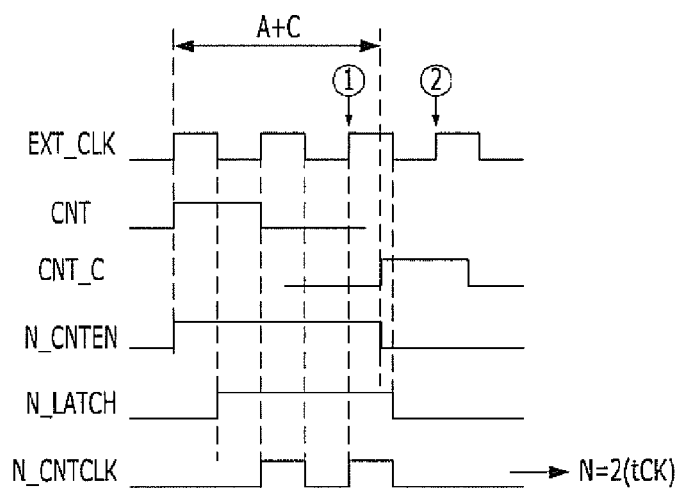
FIG. 9 is an operation timing diagram of the measurement unit illustrated in FIG. 3.

FIG. 8 is a configuration diagram of the measurement unit 113 illustrated in FIG. 3, and FIG. 9 is an operation timing diagram of the measurement unit 113 illustrated in FIG. 3.

Referring to FIGS. 8 and 9, the measurement unit 113 includes an R/S flip-flop 801, a latch 803, a gate 805, and a counter 807. The R/S flip-flop 801 activates a count signal N_CNTEN to a high level from the point of time when the measurement signal CNT is activated to a high level to the point of time when the delayed measurement signal CNT_C is activated to a high level. The latch 803 latches the count signal N_CNTEN when the external clock EXTCLK is low. The gate 805 receives the latched count signal N_CNTLAT and the external clock EXTCLK and generates the count clock N_CNTCLK that becomes high only when the two signals are high at the same time. The counter 807 counts the number of toggling of the count clock N_CNTCLK and outputs the resultant value as the path information N.

Therefore, as illustrated in FIG. 9, the path information N becomes 2 clocks if the delayed measurement signal CNT_C is activated between the rising edge ① and the rising edge ② of the external clock EXTCLK. In this manner, the step of generating the path information N is completed.

When the driving signal CMD is applied after the measurement of the path information N is completed, the delaying step of generating the latency signal CMD_LT is performed.

Figure 10:
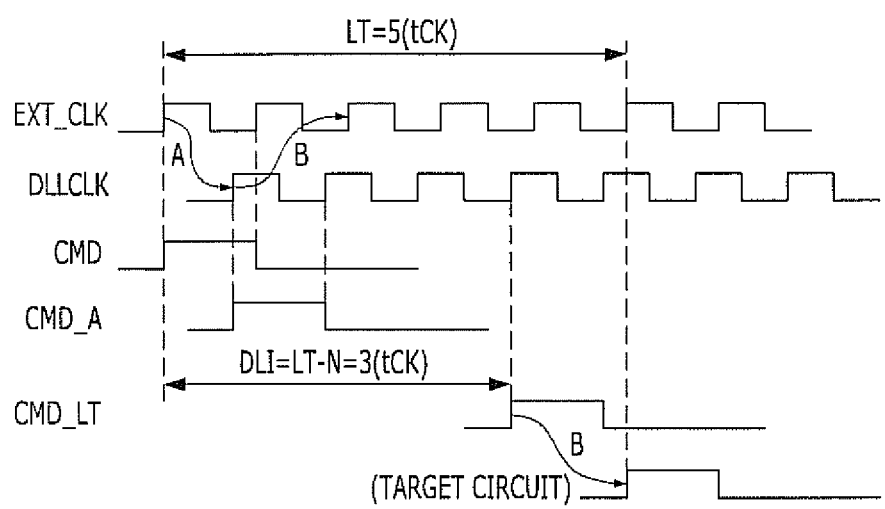
FIG. 10 is an operation timing diagram explaining the operation of generating a latency signal in the delay control circuit in accordance with an embodiment of the present invention.

FIG. 10 is an operation timing diagram of the operation of generating the latency signal in the delay control circuit in accordance with the embodiment of the present invention.

Referring to FIGS. 3 and 10, in the delaying step, the driving signal CMD of the target circuit is inputted through the signal selection unit 107, and the first delay unit 109 delays the driving signal CMD by the first delay amount and outputs the delayed driving signal CMD_A. Therefore, the delayed driving signal CMD_A is synchronized with the internal clock DLLCLK.

The operation unit 115 subtracts the path information N from the latency LT of the driving signal CMD and provides the delay information DLI (DLI=LT−N) to the latency delay unit 117. As illustrated in FIG. 10, if the latency LT of the driving signal CMD is 5 clocks and the path information N is 2 clocks, the delay information DLI becomes 3 clocks.

The latency delay unit 117 further delays the delayed driving signal CMD_A by the delay information DLI (3 clocks) and generates the latency signal CMD_LT. After the time corresponding to the delay amount B of the second replica delay unit 103, the latency signal CMD_LT reaches the target circuit which actually performs an operation relative to the driving signal CMD. Therefore, the target circuit can perform the relative operation after the time corresponding to the latency LT (5 clocks) from the input of the driving signal CMD to the semiconductor device.

Meanwhile, the delay control circuit in accordance with the embodiment of the present invention may be commonly used in various semiconductor devices operating in synchronization with the system, such as synchronous semiconductor memory devices (e.g., DDR SDRAM).

In a case in which the delay control circuit in accordance with the embodiment of the present invention is used in the semiconductor memory device, the driving signal CMD may be a write command for receiving data and storing the received data, and the latency LT of the driving signal CMD may be a CAS write latency (CWL). Also, the driving signal CMD may be a read command for outputting stored data, and the latency LT of the driving signal CMD may be a CAS latency (CL).

The target circuit to which the latency signal generated by the write or read command is transferred may be a data input/output circuit of a semiconductor memory device. In this case, the operation unit 115 of FIG. 3 may subtract the measured path information N from the latency LT, subtract the data alignment time (e.g., 2 clocks) from the subtraction result value, and generate the final resultant value as the delay information DLI. The data input/output circuit may generate a data strobe signal in response to the latency signal generated by the write or read command and perform the data input/output operations using the data strobe signal.

In accordance with exemplary embodiments of the present invention, the latency signal can be generated at accurate timing, without errors, by controlling the replica delay amount of the delay control circuit based on the latency of the driving signal. That is, since the latencies of the driving signal are different based on operating frequencies, errors may be prevented from occurring in the path information measurement value by setting the optimized replica delay amount based on the operating frequency range corresponding to the latency. Therefore, the operational reliability of the delay control circuit can be increased in the wide frequency range.

While the present invention has been described with respect to the specific embodiments, it will be apparent to those skilled in the art that various changes and modifications may be made without departing from the spirit and scope of the invention as defined in the following claims.

What is claimed is:

1. A delay control circuit comprising:
a delay locked loop configured to delay an external clock by a first delay amount and generate an internal clock;
a first delay unit configured to delay an input signal by the first delay amount;
a first replica delay unit having a replica delay amount corresponding to a modeled delay amount of a system including the delay control circuit;
a delay control unit configured to control the replica delay amount in response to a latency of an input signal;
a measurement unit configured to measure the first delay amount and the controlled replica delay amount and generate path information;
an operation unit configured to generate delay information in response to the latency of the input signal and the path information; and
a latency delay unit configured to delay the delayed input signal of the first delay unit according to the delay information and generate a latency signal.

2. The delay control circuit of claim 1, wherein the latency of the input signal is determined in response to an operating frequency of the system.

3. The delay control circuit of claim 1, wherein the measurement unit is configured to generate the path information by summing the first delay amount and the controlled replica delay amount.

4. The delay control circuit of claim 1, wherein the measurement unit is configured to generate the path information by counting the number of toggling of the external clock while a signal for measuring the path information is delayed through the first delay unit and the first replica delay unit.

5. The delay control circuit of claim 1, wherein the operation unit is configured to generate the delay information by subtracting the path information from the latency of the input signal.

6. The delay control circuit of claim 1, wherein the latency of the input signal, the path information, and the delay information have a value corresponding to cycles of the external clock.

7. The delay control circuit of claim 1, wherein the latency signal is synchronized with the internal clock.

8. A delay control circuit comprising:
a delay locked loop configured to delay an external clock by a first delay amount and generate an internal clock;
a first delay unit configured to delay a measurement signal or a driving signal by the first delay amount based on an operation step;
a first replica delay unit configured to delay the measurement signal outputted from the first delay unit by a replica delay amount;
a delay control unit configured to control the replica delay amount in response to a latency of the driving signal;
a measurement unit configured to generate path information in response to the measurement signal inputted to the first delay unit and the measurement signal outputted from the first replica delay unit;
an operation unit configured to generate delay information in response to the latency of the driving signal and the path information; and
a latency delay unit configured to delay the driving signal outputted from the first delay unit by the delay information and generate a latency signal.

9. The delay control circuit of claim 8, wherein the operating step includes a measuring step and a delay step and wherein the first replica delay unit, the delay control unit, the measurement unit, and the operation unit are configured to operate in response to the measurement signal outputted from the first delay unit in the measuring step and the latency delay unit is configured to operate in response to the driving signal outputted from the first delay unit in the delaying step.

10. The delay control circuit of claim 9, wherein the measuring step starts after the first delay amount is locked in the delay locked loop, and the delaying step starts after the delay information is generated in the measuring step.

11. The delay control circuit of claim 9, wherein the measurement signal is applied to the first delay unit in the measuring step, and the driving signal is applied to the first delay unit in the delaying step.

12. The delay control circuit of claim 8, wherein the delay locked loop comprises:
   a second delay unit configured to delay the external clock by the first delay amount and generate the internal clock;
   a second replica delay unit configured to delay the internal clock by a modeled delay amount of a path inside a chip and generate a feedback clock; and
   a phase comparison unit configured to compare a phase of the external clock with a phase of the feedback clock and control the first delay amount.

13. The delay control circuit of claim 12, wherein the phase comparison unit is configured to control the first delay amount to synchronize the phase of the external clock with the phase of the feedback clock.

14. A semiconductor memory device comprising:
   a delay locked loop configured to delay an external clock by a first delay amount and generate an internal clock;
   a first delay unit configured to delay a measurement signal or a driving signal by the first delay amount based on an operation step;
   a first replica delay unit configured to delay the measurement signal outputted from the first delay unit by a replica delay amount;
   a delay control unit configured to control the replica delay amount in response to a latency of the driving signal;
   a measurement unit configured to generate path information in response to the measurement signal inputted to the first delay unit and the measurement signal outputted from the first replica delay unit;
   an operation unit configured to generate delay information in response to the latency of the driving signal and the path information;
   a latency delay unit configured to delay the driving signal outputted from the first delay unit by the delay information and generate a Latency signal; and
   a data input/output unit configured to perform a data input/output operation when the latency signal is activated.

15. The semiconductor memory device of claim 14, wherein the driving signal is a write command, and the latency of the driving signal is a column address strobe (CAS) write latency (CWL).

16. The semiconductor memory device of claim 14, wherein the driving signal is a read command, and the latency of the driving signal is a column address strobe (CAS) latency (CL).

17. The semiconductor memory device of claim 14, wherein the operating step includes a measuring step and a delay step and wherein the first replica delay unit, the delay control unit, the measurement unit, and the operation unit are configured to operate in response to the measurement signal outputted from the first delay unit in the measuring step and the latency delay unit is configured to operate in response to the driving signal outputted from the first delay unit in the delaying step.

18. The semiconductor memory device of claim 14, wherein the measurement unit is configured to generate the path information by counting the number of toggling of the external clock from the point of time when the measurement signal is inputted to the first delay unit to the point of time when the measurement signal delayed through the first delay unit and the first replica delay unit is inputted to the measurement unit.

19. The semiconductor memory device of claim 14, wherein the operation unit is configured to generate the delay information by subtracting the path information and data alignment time from the latency of the driving signal.

20. The semiconductor memory device of claim 14, further comprising a signal selection unit configured to selectively transfer the measurement signal and the driving signal to the first delay unit based on the operation step.

* * * * *